(12) United States Patent
Seto et al.

(10) Patent No.: US 7,368,349 B2
(45) Date of Patent: May 6, 2008

(54) SEMICONDUCTOR MEMORY DEVICE AND METHOD OF MANUFACTURING THE SAME

(75) Inventors: Masaru Seto, Miyagi (JP); Junya Maneki, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 182 days.

(21) Appl. No.: 11/364,175

(22) Filed: Mar. 1, 2006

(65) Prior Publication Data
US 2006/0202260 A1    Sep. 14, 2006

(30) Foreign Application Priority Data
Mar. 14, 2005   (JP) .............................. 2005-070643

(51) Int. Cl.
*H01L 21/336*   (2006.01)
(52) U.S. Cl. ..................... 438/259; 438/201; 438/257
(58) Field of Classification Search ................ 437/201, 437/257, 259
See application file for complete search history.

(56) References Cited

U.S. PATENT DOCUMENTS 5,990,509 A    11/1999   Burns, Jr. et al.

2002/0132416 A1   9/2002   Gamo et al.

FOREIGN PATENT DOCUMENTS

| JP | H10-189917  | 7/1998 |
| JP | 2002-033405 | 1/2002 |
| JP | 2002-280464 | 9/2002 |

*Primary Examiner*—Douglas M. Menz
(74) *Attorney, Agent, or Firm*—Volentine & Whitt, P.L.L.C.

(57) ABSTRACT

A semiconductor memory device includes: a laminated body which has a floating-gate-forming groove and includes a semiconductor support layer, an impurity diffusion layer, an ion-implantation-damage protection film, and an interlayer insulating film; a floating-gate-insulating film; a floating gate disposed on the floating-gate-insulating film so as to be buried in the floating-gate-forming groove; a control-gate-insulating film disposed on a surface area of the floating gate; and a control gate disposed on the control-gate-insulating film above the floating gate, wherein the floating-gate-insulating film contacts with the semiconductor support layer at the bottom of the floating-gate-forming groove, the floating-gate-insulating film contacts with the impurity diffusion layer, the ion-implantation-damage protection film, and the interlayer insulating film at the side wall of the floating-gate-forming groove.

4 Claims, 8 Drawing Sheets

SEMICONDUCTOR MEMORY DEVICE AND METHOD OF MANUFACTURING THE SAME

BACKGROUND OF THE INVENTION

1. Field of the Invention

The present invention relates to a semiconductor memory device such as a nonvolatile semiconductor memory and a method of manufacturing a semiconductor memory device.

2. Description of the Related Art

The nonvolatile semiconductor memory is able to retain stored data without requiring electricity, and is used as a memory in a low power-consumption device such as a mobile device. Recently, an Oxide-Nitride-Oxide (ONO) structure having a silicon nitride film capable of storing electric charge and a floating gate structure having a polysilicon are widely used as the nonvolatile semiconductor memory. The ONO structure is disclosed in, for example, the Japanese Patent Application Kokai (Laid-Open) Publication No. 2002-280464 (referred to as Patent Document 1). The floating gate structure is disclosed in, for example, the Japanese Patent Application Kokai (Laid-Open) Publication No. 2002-33405 (referred to as Patent Document 2).and the Japanese Patent Application Kokai (Laid-Open) Publication No. 10-189917 (referred to as Patent Document 3).

In the nonvolatile semiconductor memory having the floating gate structure disclosed in Patent Document 2, the floating gates and the control gates are laminated via the silicon oxide layers on the semiconductor substrate, on which impurity diffusion regions serving as bit lines are formed.

In the nonvolatile semiconductor memory having the floating gate structure disclosed in Patent Document 3, the grooves are formed on the semiconductor substrate, and the floating gates are formed in the grooves. Impurity ions are implanted into parts of the semiconductor substrate, in which the floating gates are not formed in the grooves, so that the impurity diffusion regions serving as bit lines are formed.

However, in the nonvolatile semiconductor memory disclosed in Patent Document 2, the floating gate and the control gate are formed on the semiconductor substrate, and therefore the height of the memory cell region, in which the gates are formed, becomes higher than the surrounding transistor regions. If the height of the memory cell region increases, the difference in height between the memory cell region and the transistor region increases, with the result that it becomes difficult to obtain finer cells.

In the nonvolatile semiconductor memory disclosed in Patent Document 3, the floating gate is buried in the groove, and therefore the difference in height between the memory cell region and the transistor region can be reduced. However, impurity ions are implanted into a bottom surface of the groove from right above, and implanted into a side surface of the groove in an oblique direction. Therefore, if the width of the groove is reduced for obtaining finer cells, the impurity ions are blocked by the surface to the semiconductor substrate. Therefore, the impurity ions are not implanted into a part of the side surface close to the bottom surface. As a result, the resistance of the impurity diffusion region serving as a bit line increases, so that it becomes difficult to obtain finer cells.

SUMMARY OF THE INVENTION

An object of the present invention is to provide a semiconductor memory device and a method of manufacturing a semiconductor memory device capable of reducing the height of the memory cell region without increasing electric resistance of the bit line.

According to the present invention, a semiconductor memory device includes: a laminated body including a semiconductor support layer, an impurity diffusion layer formed on the semiconductor support layer, an ion-implantation-damage protection film formed on the impurity diffusion layer, and an interlayer insulating film formed on the ion-implantation-damage protection film, the laminated body having a floating-gate-forming groove which is formed in an floating-gate-forming area of the laminated body; the semiconductor support layer being exposed to a bottom of the floating-gate-forming groove; the impurity diffusion layer, the ion-implantation-damage protection film, and the interlayer insulating film being exposed to a side wall of the floating-gate-forming groove. The semiconductor memory device further includes: a floating-gate-insulating film contacting with the semiconductor support layer at the bottom of the floating-gate-forming groove, the floating-gate-insulating film contacting with the impurity diffusion layer, the ion-implantation-damage protection film, and the interlayer insulating film at the side wall of the floating-gate-forming groove; a floating gate disposed on the floating-gate-insulating film so as to be buried in the floating-gate-forming groove; a control-gate-insulating film disposed on a surface area of the floating gate; and a control gate disposed on the control-gate-insulating film above the floating gate.

According to the present invention, a method of manufacturing a semiconductor memory device includes the steps of: forming a laminated body having a floating-gate-forming groove which is formed in an floating-gate-forming area of the laminated body, the laminated body including a semiconductor support layer, an impurity diffusion layer formed on the semiconductor support layer, an ion-implantation-damage protection film formed on the impurity diffusion layer, and an interlayer insulating film formed on the ion-implantation-damage protection film, in such a way that the semiconductor support layer is exposed to a bottom of the floating-gate-forming groove, and the impurity diffusion layer, the ion-implantation-damage protection film, and the interlayer insulating film are exposed to a side wall of the floating-gate-forming groove; forming a floating-gate-insulating film on an inner surface of the floating-gate-forming groove in such a way that the floating-gate-insulating film contacts with the semiconductor support layer at the bottom of the floating-gate-forming groove, the floating-gate-insulating film contacts with the impurity diffusion layer, the ion-implantation-damage protection film, and the interlayer insulating film at a side wall of the floating-gate-forming groove; forming a floating gate on the floating-gate-insulating film so as to be buried in the floating-gate-forming groove; forming a control-gate-insulating film on a surface area of the floating gate; and forming a control gate on the control-gate-insulating film above the floating gate.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

A nonvolatile semiconductor memory as a semiconductor memory device and a method of manufacturing a semiconductor memory device according to the first embodiment will be described with reference to FIGS. 1A through 1D to FIGS. 5A through 5B.

Figure 2A:
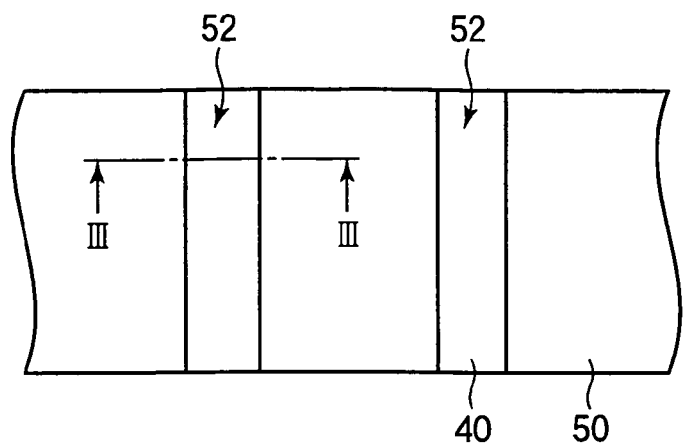
FIGS. 2A through 2C are schematic plan views showing the manufacturing process of the nonvolatile semiconductor memory according to the first embodiment.
Figure 2B:
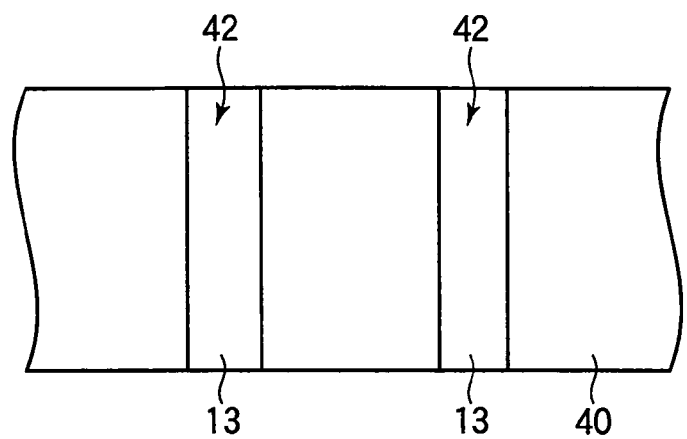
Figure 2C:
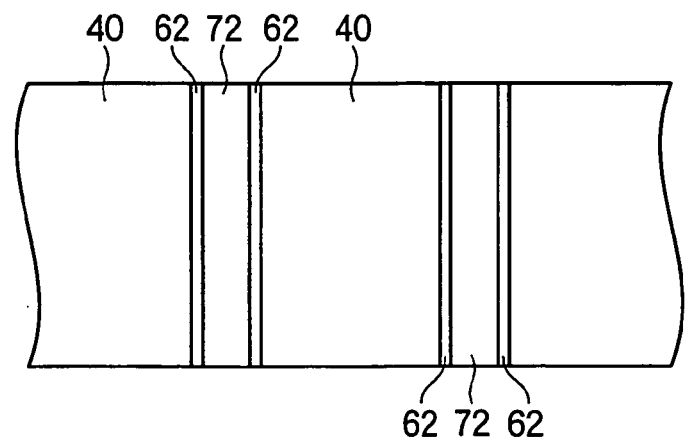
Figure 3A:
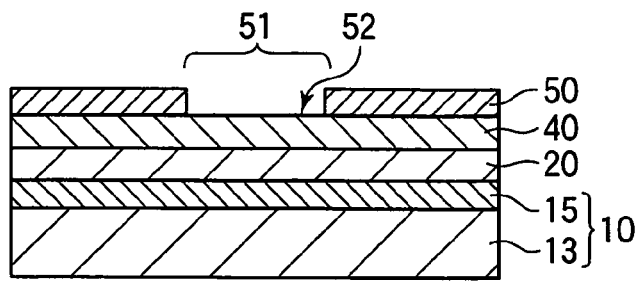
FIGS. 3A through 3F are schematic sectional views showing the manufacturing process of the nonvolatile semiconductor memory according to the first embodiment subsequent to the manufacturing process shown in FIGS. 1A through 1D.
Figure 4A:
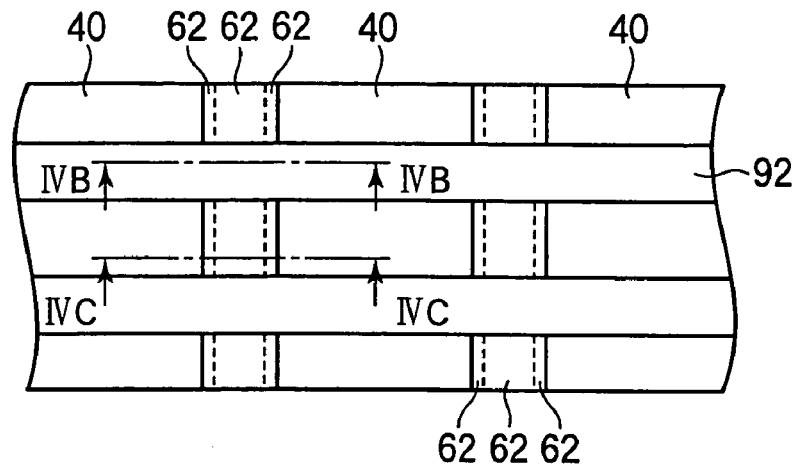
FIGS. 4A through 4C are a schematic plan view and schematic sectional views showing the manufacturing process of the nonvolatile semiconductor memory according to the first embodiment subsequent to the manufacturing process shown in FIGS. 2A through 2C and FIGS. 3A through 3C.
Figure 4B:
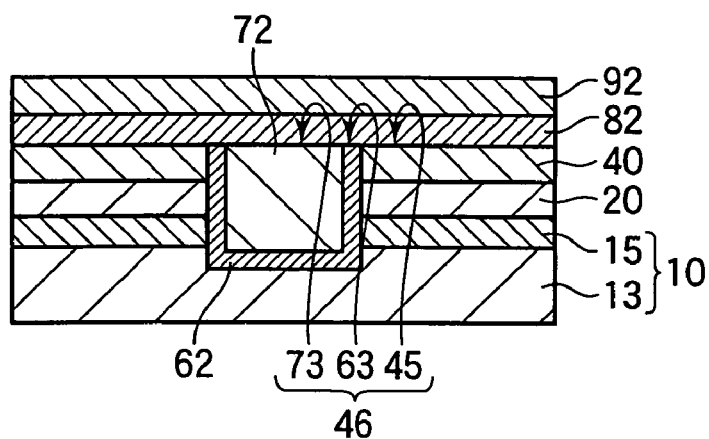
Figure 4C:
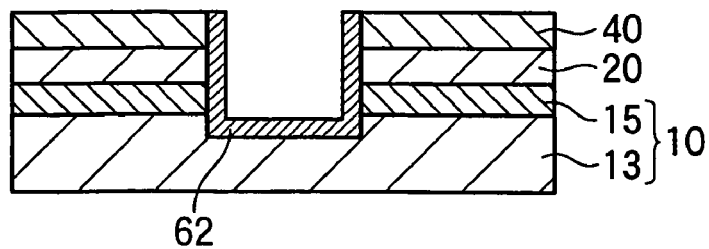
Figure 5A:
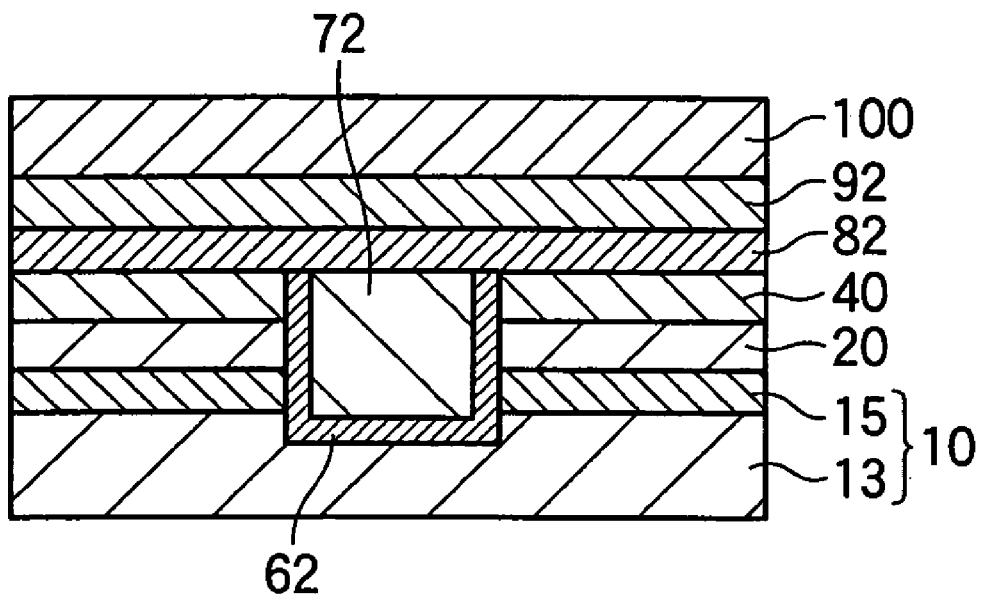
FIGS. 5A and 5B are schematic sectional views showing the manufacturing process of the nonvolatile semiconductor memory according to the first embodiment subsequent to the manufacturing process shown in FIGS. 4A thorough 4D.
Figure 5B:
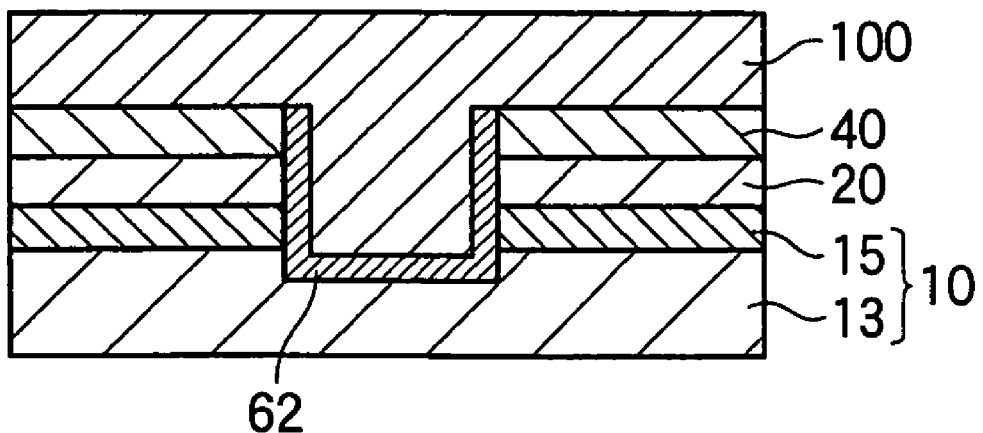

FIGS. 1A through 1D are schematic sectional views showing a manufacturing process of a nonvolatile semiconductor memory according to the first embodiment. FIGS. 2A through 2C are schematic plan views, as seen from the above, showing the manufacturing process of the nonvolatile semiconductor memory according to the first embodiment subsequent to the manufacturing process shown in FIGS. 1A through 1D. FIGS. 3A through 3F are schematic sectional views taken along a line III-III in FIG. 2A, showing the manufacturing process of the nonvolatile semiconductor memory according to the first embodiment subsequent to the manufacturing process shown in FIGS. 1A through 1D. FIGS. 4A through 4C show the manufacturing process of the nonvolatile semiconductor memory according to the first embodiment, subsequent to the manufacturing process shown in FIGS. 2A through 2C and FIGS. 3A through 3F. FIG. 4A is a schematic plan view, and FIGS. 4B and 4C are schematic sectional views taken along a line IVB-IVB and a line IVC-IVC in FIG. 4A respectively. FIGS. 5A and 5B are schematic sectional views respectively taken along a line IVB-IVB and a line IVC-IVC in FIG. 4A showing the manufacturing process of the nonvolatile semiconductor memory according to the first embodiment subsequent to the manufacturing process shown in FIGS. 4A through 4C.

Figure 1A:
FIGS. 1A through 1D are schematic sectional views showing a manufacturing process of a nonvolatile semiconductor memory according to the first embodiment of the present invention.

Referring to FIG. 1A, first, a p-type semiconductor substrate 10, in which p-type impurities are doped, is prepared.

Figure 1B:
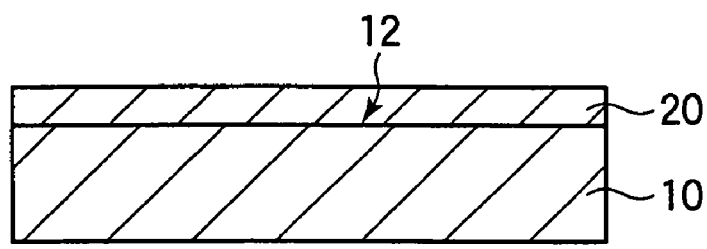

Next, referring to FIG. 1B, an ion-implantation-damage protection film 20 is formed on an upper surface 12 of the semiconductor substrate 10 for preventing the semiconductor substrate 10 from being damaged by an ion-implantation. The ion-implantation-damage protection film 20 is composed of, for example, a silicon oxide film formed by a Chemical Vapor Deposition (CVD) method or a thermal oxidation method to have a thickness of several nanometers (nm) to several tens nanometers.

Figure 1C:
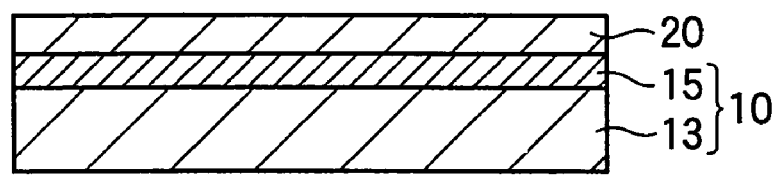

Next, referring to FIG. 1C, impurity ions are implanted into an area in the vicinity of the upper surface 12 of the semiconductor substrate 10, passing through the ion-implantation-damage protection film 20. When the semiconductor substrate 10 is p-type, the n-type impurity ions such as phosphor (P) or arsenic (As) are implanted at a concentration of approximately $1\times10^{13}$ to $1\times10^{15}$ number/cm². Then, an activation-annealing is performed on the semiconductor substrate 10 so that the area, in which the impurity ions are implanted, is changed to an impurity diffusion layer 15. As a result, the semiconductor substrate 10 includes a semiconductor support layer 13 and the impurity diffusion layer 15 formed on the semiconductor support layer 13 as shown in FIG. 1C. The activation-annealing for forming the impurity diffusion layer 15 is carried out at a temperature of 700 to 900° C. in a nitrogen atmosphere.

Figure 1D:
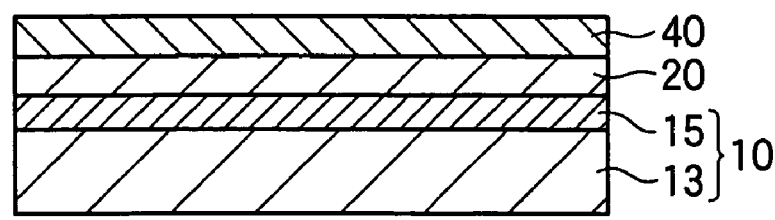

Next, referring to FIG. 1D, an interlayer insulating film (i.e., a first interlayer insulating film) 40 is formed on the ion-implantation-damage protection film 20. The interlayer insulating film 40 is formed of, for example, silicon oxide by means of a CVD method.

Next, a photo-resist is coated on the first interlayer insulating film 40, so that a photo-resist layer, which is not shown in FIGS. 1A through 1D, is formed on the first interlayer insulating film 40. Then, the patterning is performed on the photo-resist layer by means of a known photolithography method, so that openings 52 are formed on the photo-resist layer. As a result, a photo-resist pattern 50 is obtained as shown in FIG. 2A and FIG. 3A. In this step, the openings 52 are formed on positions corresponding to floating-gate-forming areas 51 as shown in FIG. 3A. The openings 52 (i.e., the floating-gate-forming areas 51) are in the form of stripes. The longitudinal direction of each stripe shown in FIG. 2A and FIG. 3A is referred to as a first direction.

Figure 3B:
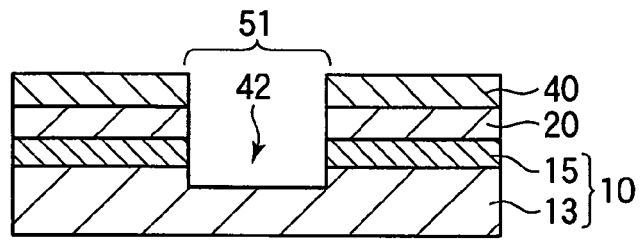

Next, referring to FIG. 3B, the first interlayer insulating film 40, the ion-implantation-damage protection film 20, and the impurity diffusion layer 15 are sequentially partially removed in a self-aligning manner by means of a dry etching using the photo-resist pattern 50 as a mask, with the result that floating-gate-forming grooves 42 are formed. The floating-gate-forming grooves 42 are formed on the first interlayer insulating film 40, the ion-implantation-damage protection film 20, and the impurity diffusion layer 15 on positions corresponding to the floating-gate-forming areas 51. An upper surface of the semiconductor support layer 13 of the semiconductor substrate 10 is exposed at the bottom surface of the floating-gate-forming grooves 42. In other words, the exposed surface of the semiconductor support layer 13 constitutes the bottom surface of the floating-gate-forming grooves 42. Then, the photo-resist pattern 50 is removed by ashing or the like. As the floating-gate-forming grooves 42 are formed, the impurity diffusion layer 15 is in the form of stripes, and the respective stripes are separated by the floating-gate-forming grooves 42, as shown in FIG. 2B and FIG. 3B. The parts of the impurity diffusion layer 15 (also referred to as impurity diffusion areas) constituting the stripes function as bit-lines.

Figure 3C:
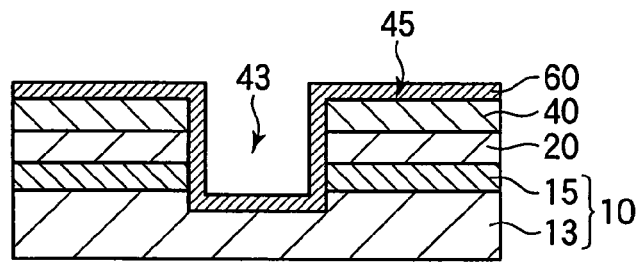

Next, referring to FIG. 3C, a first silicon oxide film 60 is formed on the bottom surface and the side wall surface of the floating-gate-forming grooves 42 and on the upper surface 45 of the first interlayer insulating film 40. In this step, the first silicon oxide film is formed by a CVD method.

Figure 3D:
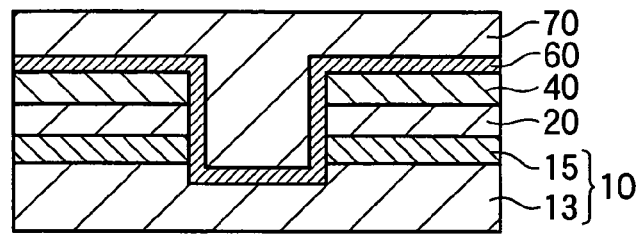

Next, referring to FIG. 3D, a first conductive film 70 is formed on the first silicon oxide film 60. The first conductive film 70 is formed by, for example, depositing the polysilicon, in which the impurities are doped, using a CVD method. In this step, the first conductive film 70 is filled in the floating-gate-forming grooves 42, i.e., grooves 43 formed by the first silicon oxide layer 60.

Figure 3E:
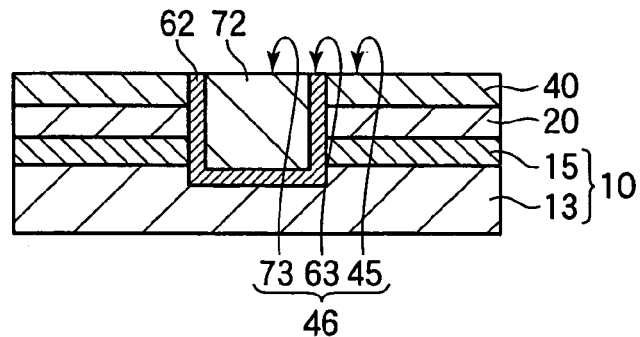

Next, referring to FIG. 3E, the parts of the first conductive film 70 and the first silicon oxide layer 60 deposited on the first interlayer insulating film 40 is removed by means of an etchback or a Chemical Mechanical Polishing (CMP). As a result, the parts of the first conductive film 70 existing in the floating-gate-forming grooves 42 (strictly speaking, the grooves 43) constitute the floating gates 72, as shown in FIG. 2C and FIG. 3E. The parts of the first silicon oxide film 60 existing on the bottom surfaces and the side wall surfaces of the floating-gate-forming grooves 42 constitute floating-gate-insulating films 62. With such an etchback or CMP process, the exposed surfaces 73 of the floating gates 72, the exposed surfaces 63 of the floating-gate-insulating films 62, and the upper surface 45 of the first interlayer insulating film 40 constitute a plane surface 46 (hereinafter referred to as an upper plane surface 46). Further, in the etchback or CMP process, it is possible that the first silicon oxide layer 60 remains on the first interlayer insulating film 40, as long as the first conductive film 70 on the first interlayer insulating film 40 is removed.

Figure 3F:
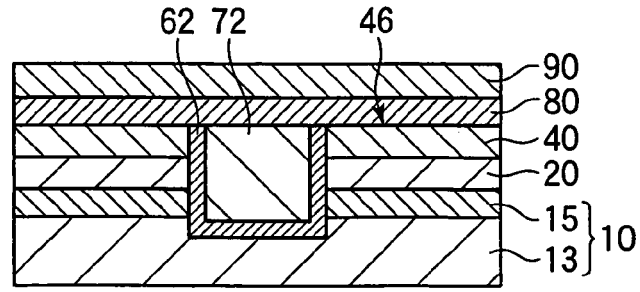

Next, referring to FIG. 3F, a second silicon oxide layer 80 is formed on the upper plane surface 46 by means of a CVD method or the like. Then, a second conductive film 90 is formed on the second silicon oxide layer 80 as shown in FIG. 3F. For example, the second conductive film 90 is formed to have a polycide structure, in which metal silicide is laminated on polysilicon.

Next, referring to FIGS. 4A and 4B, the second conductive film 90 is patterned by an arbitrary and suitable known photolithography and dry etching, so that stripe-shaped control gates 92 are formed. In this patterning, the longitudinal direction of the control gates 92 is in a second direction perpendicular to the first direction. Each of the stripe-shaped control gates 92 functions as a word line. In areas where no control gate 92 exists, the floating gates 72 in the floating-gate-forming grooves 42 are also removed by etching as shown in FIG. 4C. The parts of the second silicon oxide layer 80 covered by the control gates 92 remain and constitute a control-gate-insulating film 82 as shown in FIG. 4B.

Next, referring to FIGS. 5A and 5B, a second interlayer insulating film 100 is formed on the control gates 92 and the interlayer insulating film 40 and in the floating-gate-forming grooves 42, from which the floating gates 72 are removed. The second interlayer insulating film 100 is formed of, for example, a silicon oxide film by means of a CVD method.

Next, contact portions (not shown) are formed in the second interlayer insulating film 100 for electrically connecting the impurity diffusion layer 15 and the upper wirings (not shown) formed on the second interlayer insulating film 100.

The semiconductor memory device according to the first embodiment will be described below. The semiconductor memory device is manufactured by, for example, the above described method. Referring to FIG. 5A, the semiconductor memory device according to the first embodiment includes a laminated body including a semiconductor support layer 13, an impurity diffusion layer 15 formed on the semiconductor support layer 13, an ion-implantation-damage protection film 20 formed on the impurity diffusion layer 15, and an interlayer insulating film 40 formed on the ion-implantation-damage protection film 20. The laminated body has the floating-gate-forming groove 42 (FIG. 3B) which is formed in a floating-gate-forming area 51 (FIG. 3A) of the laminated body. The semiconductor support layer 13 is exposed to the interlayer insulating film 62 at a bottom of the floating-gate-forming groove 42. The impurity diffusion layer 15, the ion-implantation-damage protection film 20, and the interlayer insulating film 40 are exposed to the interlayer insulating film 62 at a side wall of the floating-gate-forming groove 42. The semiconductor memory device also includes the floating-gate-insulating film 62 contacting with the semiconductor support layer 13 at the bottom of the floating-gate-forming groove 42, the floating-gate-insulating film 62 contacting with the impurity diffusion layer 15, the ion-implantation-damage protection film 20, and the interlayer insulating film 40 at an inner side surface of the floating-gate-forming groove 42. The semiconductor memory device further includes a floating gate 72 disposed on the floating-gate-insulating film 62 so as to be buried in the floating-gate-forming groove 42; a control-gate-insulating film 82 disposed on a surface area of the floating gate 72; and a control gate 92 disposed on the control-gate-insulating film 82 above the floating gate 72.

According to the above described first embodiment, the semiconductor memory device is formed in such a manner that the floating gate is buried in the semiconductor substrate. Thus, the height of the memory cell areas can be reduced, and therefore the difference in height between the memory cell areas and surrounding transistor areas can be reduced. Accordingly, a finer semiconductor memory device can be obtained.

Moreover, the floating-gate-forming grooves are formed after the ion-implanting on the semiconductor substrate, so that the impurity diffusion layer is separated in the stripe shape to form the impurity diffused parts which function as bit lines. Therefore, it becomes possible to prevent the increase of the electric resistance in the impurity diffused areas, with the result that the above semiconductor memory device can be easily manufactured.

Second Embodiment

A method of manufacturing a semiconductor memory device as a nonvolatile semiconductor memory according to the second embodiment will be described with reference to FIGS. 6A through 6D. FIGS. 6A through 6D are schematic sectional views showing the manufacturing process of the nonvolatile semiconductor memory according to the second embodiment. In the second embodiment, the components that are the same as or correspond to those of the first embodiment are assigned the same reference numeral.

The forming step of the ion-implantation-damage protection film 20 and its previous steps are the same as those described in the first embodiment with reference to FIGS. 1A and 1B.

Figure 6A:
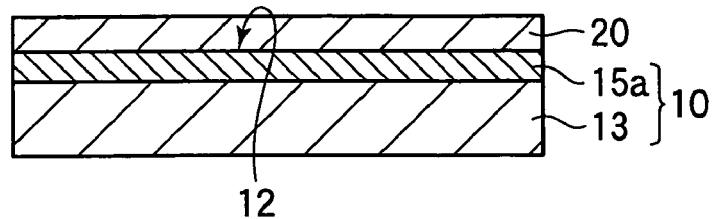
FIGS. 6A through 6D are schematic sectional views showing a manufacturing process of a nonvolatile semiconductor memory according to the second embodiment of the present invention.

Next, referring to FIG. 6A, impurity ions are implanted into an area in the vicinity of the upper surface 12 of the semiconductor substrate 10, passing through the ion-implantation-damage protection film 20. When the semiconductor substrate 10 is p-type, the n-type impurity ion such as phosphor (P) or arsenic (As) is implanted at a concentration of approximately $1 \times 10^{13}$ to $1 \times 10^{15}$ number/cm$^2$. The area, in which the impurity ions are implanted, is an ion-implanted layer 15a. As a result, the semiconductor substrate 10 includes a semiconductor support layer 13 and the ion-implanted layer (also referred to as impurity-implanted layer) 15a formed on the semiconductor support layer 13.

Figure 6B:
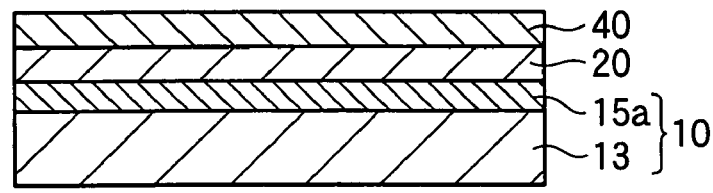
Figure 6C:
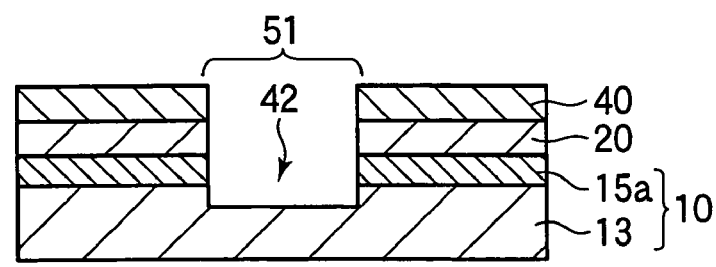

Next, referring to FIG. 6B, an interlayer insulating film (i.e., a first interlayer insulating film) 40 is formed on the ion-implantation-damage protection film 20. The interlayer insulating film 40 is formed of, for example, silicon oxide by means of a CVD method.

Next, a photo-resist which corresponds to the layer 50 shown in FIG. 3A is coated on the first interlayer insulating film 40, so that a photo-resist layer which is not shown in FIGS. 6A through 6D is formed on the first interlayer insulating film 40. Then, referring to FIG. 6C, the first interlayer insulating film 40, the ion-implantation-damage protection film 20, and the ion-implanted layer 15a are partially removed in a self-aligning manner by means of a known photolithography method or a dry etching method, so that the floating-gate-forming grooves 42 are formed. The removed areas of the first interlayer insulating film 40, the ion-implantation-damage protection film 20, and the ion-implanted layer 15a correspond to the floating-gate-forming areas 51. The upper surface of the semiconductor support layer 13 of the semiconductor substrate 10 is exposed at the bottom surfaces of the floating-gate-forming grooves 42. Then, the photo-resist pattern 50 (shown in FIG. 3A) is removed by ashing or the like. Referring to FIG. 6B, since the floating-gate-forming grooves 42 are formed, the ion-implanted layer 15a is separated by the floating-gate-forming grooves 42 in the shape of stripes.

Figure 6D:
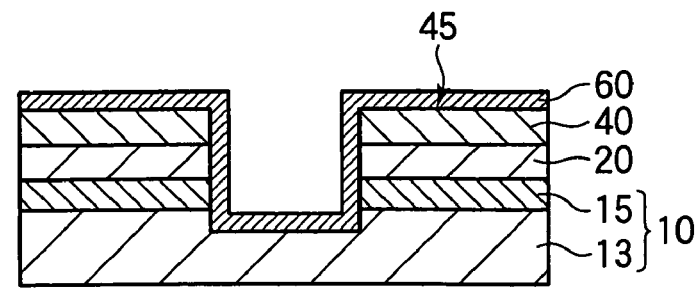

Next, referring to FIG. 6D, a first silicon oxide film 60 is formed on the bottom surface and the side wall surface of the floating-gate-forming grooves 42, and on the upper surface 45 of the first interlayer insulating film 40. In this step, the first silicon oxide film 60 is formed by a CVD method. In this CVD method, the reaction temperature is set from 700 to 900° C. for performing activation-annealing, with the result that the ion-implanted layer 15a is activated and becomes an impurity diffusion layer 15. The impurity diffusion layer 15 is in the shape of stripes, and each of the strip functions as a bit-line.

The steps after the impurity diffusion layer 15 is formed are the same as those described with reference to FIG. 2C, FIGS. 3D and 3F, FIGS. 4A through 4C, and FIGS. 5A and 5B in the first embodiment.

According to the method of manufacturing the semiconductor memory device of the second embodiment, the same advantages as the first embodiment can be obtained. In addition, since the activation process for forming the impurity diffusion layer 15 is performed in the forming process of the first silicon oxide film 60 after the floating-gate-forming grooves 42 were formed, the number of steps can be reduced.

Third Embodiment

A method of manufacturing a semiconductor memory device as a nonvolatile semiconductor memory according to the third embodiment will be described with reference to FIGS. 7A through 7C and FIGS. 8A through 8B. In the third embodiment, the components that are the same as or correspond to those of the first embodiment are assigned the same reference numeral.

Figure 7A:
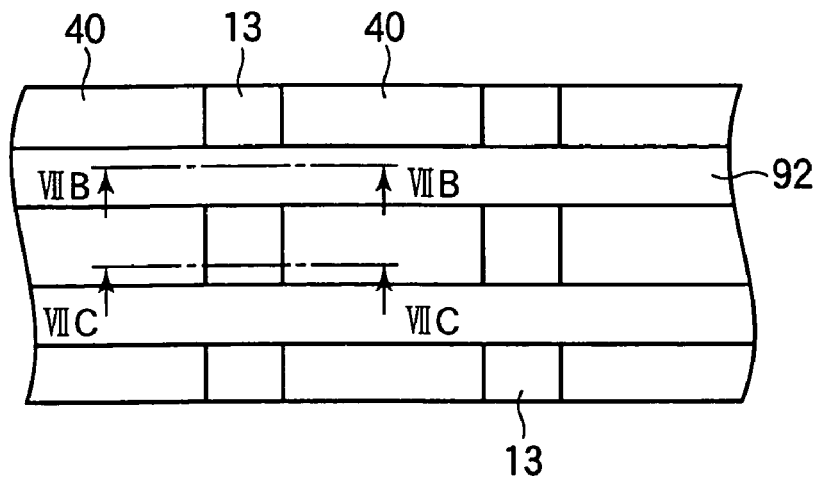
FIGS. 7A through 7C are schematic sectional views showing a manufacturing process of a nonvolatile semiconductor memory according to the third embodiment of the present invention.
Figure 7B:
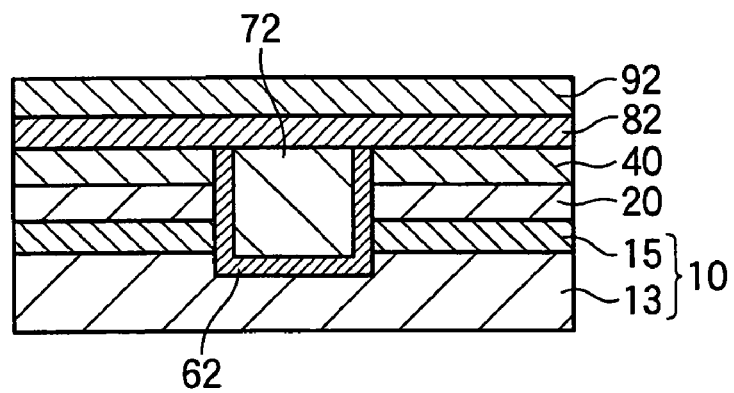
Figure 7C:
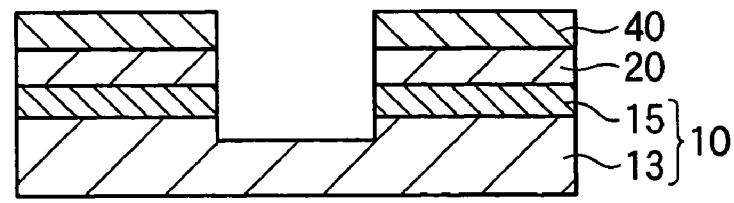
Figure 8A:
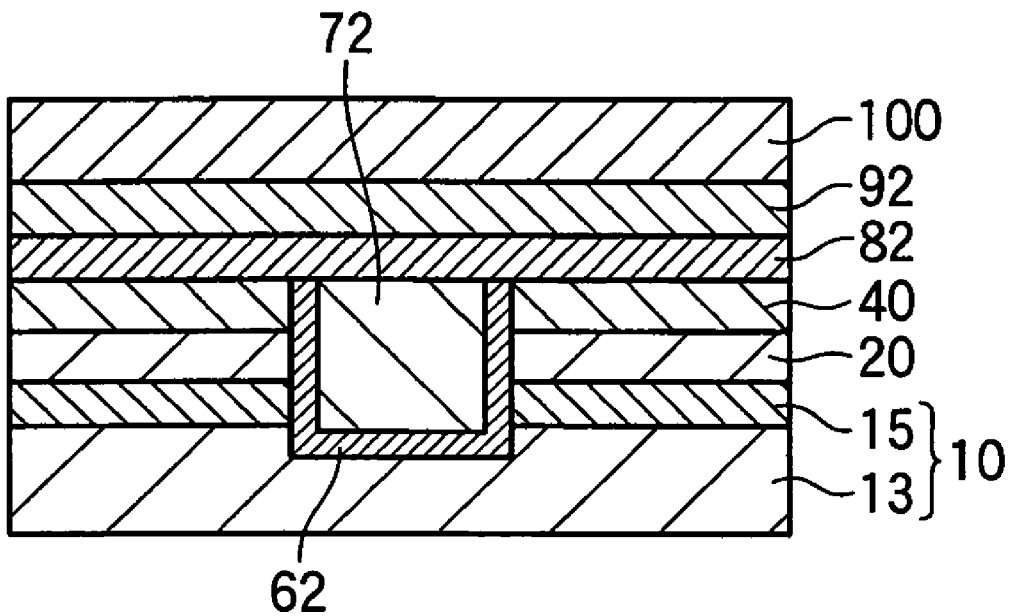
FIGS. 8A and 8B are schematic sectional views showing the manufacturing process of the nonvolatile semiconductor memory according to the third embodiment.
Figure 8B:
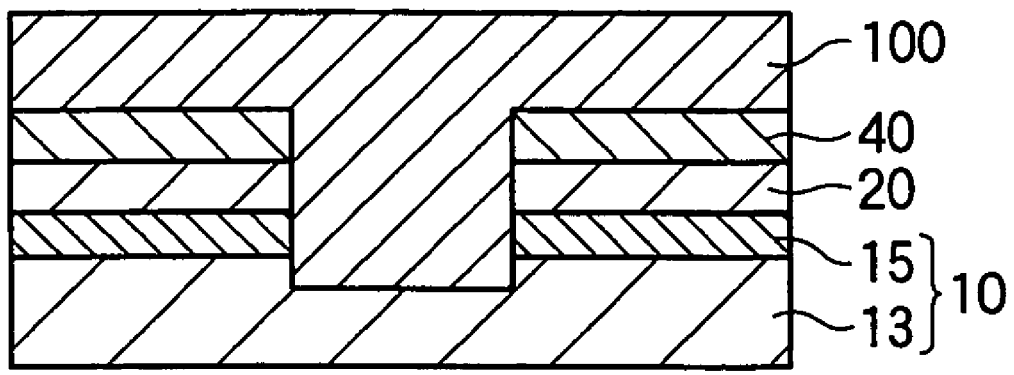

FIG. 7A is a schematic plan view as seen from the above, FIG. 7B is a schematic sectional view taken along a line VIIB-VIIB in FIG. 7A, and FIG. 7C is a schematic sectional view taken along a line VIIC-VIIC in FIG. 7A. FIGS. 8A and 8B are schematic sectional views showing the manufacturing process of the nonvolatile semiconductor memory according to the third embodiment. FIGS. 8A and 8B are schematic sectional views corresponding to the sectional views taken along a line VIIB-VIIB in FIG. 7A and a line VIIC-VIIC in FIG. 7A respectively. The third embodiment differs from the first embodiment in the following respects.

The same manufacturing process as that described in the first embodiment referring to FIGS. 1A through 1D to FIGS. 3A through 3F or in the second embodiment referring to FIGS. 6A through 6D are performed in the third embodiment until an upper plane surface 46 including the exposed surfaces 73 and 63 of the floating gate 72 and the floating-gate-insulating film 62 is formed, and the second silicon layer 80 and the second conductive layer 90 are formed on the upper plane surface 46.

Next, referring to FIGS. 7A and 7B, the second conductive film 90 is patterned by an arbitrary and suitable known photolithography and dry etching, so that stripe-shaped control gates 92 are formed. In this patterning, the longitudinal direction of the control gates 92 is in a second direction perpendicular to the first direction. Each of the stripe-shaped control gates 92 functions as a word line. Referring to FIG. 7C, in areas where no control gate 92 exists, the floating gates 72 in the floating-gate-forming grooves 42 are also removed by etching. In areas where no control gate 92 exists, the floating-gate-insulating film is also removed. The parts of the second silicon oxide layer 80 covered by the control gates 92 remain and constitute a control-gate-insulating film 82 as shown in FIGS. 7A through 7C.

Next, referring to FIGS. 8A and 8B, a second interlayer insulating film 100 is formed on the control gates 92 and the interlayer insulating film 40 and in the floating-gate-forming grooves 42, from which the floating gates 72 are removed.

According to the method of manufacturing the semiconductor memory device, the semiconductor support layer 13 in the bottom surface of the floating-gate-forming groove is over-etched in order to perfectly remove the floating-gate-insulating film 62. Therefore, an effective length between the impurity diffusion layers 15 is increased, and then electrical leakage can be suppressed.

When the depth D of the groove becomes larger than the width W of the groove in a finer device, an aspect ration D/W becomes smaller by removing the floating-gate-insulating film 62 in the floating-gate-forming groove from which the floating gate 72 has been removed. In this case, since it is easy to fill up the floating-gate-forming groove with the second interlayer insulating film 100, a problem such as a short-circuit resulting from improper filling-up of the floating-gate-forming groove using the second interlayer insulating film 100.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of manufacturing a semiconductor memory device comprising the steps of:
   forming a laminated body having a floating-gate-forming groove which is formed in an floating-gate-forming area of the laminated body, the laminated body including a semiconductor support layer, an impurity diffusion layer formed on the semiconductor support layer, an ion-implantation-damage protection film formed on the impurity diffusion layer, and an interlayer insulating film formed on the ion-implantation-damage protection film, in such a way that the semiconductor support layer is exposed to a bottom of the floating-gate-forming groove, and the impurity diffusion layer, the ion-implantation-damage protection film, and the interlayer insulating film are exposed to a side wall of the floating-gate-forming groove;
   forming a floating-gate-insulating film on an inner surface of the floating-gate-forming groove in such a way that the floating-gate-insulating film contacts with the semiconductor support layer at the bottom of the floating-gate-forming groove, the floating-gate-insulating film contacts with the impurity diffusion layer, the ion-implantation-damage protection film, and the interlayer insulating film at a side wall of the floating-gate-forming groove;
   forming a floating gate on the floating-gate-insulating film so as to be buried in the floating-gate-forming groove;
   forming a control-gate-insulating film on a surface area of the floating gate; and
   forming a control gate on the control-gate-insulating film above the floating gate.

2. The method according to claim 1, wherein the step of forming the laminated body includes the steps of:
   forming the ion-implantation-damage protection film on a semiconductor substrate;
   implanting an impurity ion into the semiconductor substrate through the ion-implantation-damage protection film to form an ion-implanted area in the semiconductor substrate;
   performing activation-annealing of the semiconductor substrate, thereby changing the ion-implanted area to the impurity diffusion layer;
   forming the interlayer insulating film; and
   subsequently forming the floating-gate-forming groove.

3. The method according to claim 1, wherein the step of forming the laminated body includes the steps of:
   forming the ion-implantation-damage protection film on a semiconductor substrate;
   implanting an impurity ion into the semiconductor substrate through the ion-implantation-damage protection film to form an ion-implanted area in the semiconductor substrate;
   forming the interlayer insulating film;
   forming the floating-gate-forming groove; and
   subsequently performing activation-annealing of the semiconductor substrate, thereby changing an ion-implanted area to the impurity diffusion layer.

4. The method according to claim 1, further comprising:
   removing a part of the floating-gate-insulating film from an area where no control gate exists; and
   filling up a part of the floating-gate-forming groove, where the floating-gate-insulating film is removed, with an insulating material.

* * * * *